(12) United States Patent
Lung et al.

(10) Patent No.: US 6,282,118 B1
(45) Date of Patent: Aug. 28, 2001

(54) NONVOLATILE SEMICONDUCTOR MEMORY DEVICE

(75) Inventors: Hsiang-Lan Lung, Hsinchu; Tung-Cheng Kuo, Lotung Yilan; Shue-Shuen Chen, Yunlin, all of (TW)

(73) Assignee: Macronix International Co. Ltd., Hsinchu (TW)

( * ) Notice: Subject to any disclaimer, the term of this patent is extended or adjusted under 35 U.S.C. 154(b) by 0 days.

(21) Appl. No.: 09/684,295

(22) Filed: Oct. 6, 2000

(51) Int. Cl.[7] .................................................. G11C 14/00
(52) U.S. Cl. ...................................... 365/185.08; 365/149
(58) Field of Search ............................... 365/185.08, 228, 365/226, 189.05, 149

(56) References Cited

U.S. PATENT DOCUMENTS

| | | | |
|---|---|---|---|
| 5,043,946 | * 8/1991 | Yamauchi | 365/185.08 |
| 5,262,986 | * 11/1993 | Yamauchi | 365/185.08 |
| 5,590,073 | * 12/1996 | Arakawa | 365/185.33 |
| 5,623,442 | * 4/1997 | Gotou | 365/185.08 |

* cited by examiner

Primary Examiner—A. Zarabian

(57) ABSTRACT

A nonvolatile semiconductor memory device adapted for a semiconductor substrate includes a Dynamic Random Access Memory (DRAM) cell and a nonvolatile erasable programmable (NEP) transistor. The DRAM cell includes a control transistor having a first gate connected to a first word line, a first source connected to a first bit line, and a first drain connected to a storage capacitor, and data stored in the capacitor is controlled by the control transistor. The NEP transistor has a second gate connected to a second word line, a second source connected to the first drain, and a second drain connected to a second bit line. Wherein, the data stored in the capacitor and nonvolatile erasable programmable transistor is transmitted and exchanged by a transfer circuit through the first and second bit lines.

15 Claims, 5 Drawing Sheets

NONVOLATILE SEMICONDUCTOR MEMORY DEVICE

FIELD OF THE INVENTION

The present invention relates to a semiconductor memory device, and more particularly to a Dynamic Random Access Memory (DRAM) having nonvolatile silicon oxide-silicon nitride-silicon oxide (ONO) gate.

BACKGROUND OF THE INVENTION

There are essentially two types of data memory devices used in computers today, "Nonvolatile" and "Volatile". Common nonvolatile memory devices include well known Read Only Memory (ROM) devices that include EPROM (erasable programmable ROM) devices, EEPROM (electrically erasable programmable ROM) devices, and Flash EEPROM devices. These nonvolatile memory devices maintain the data stored therein, even when power to the device is removed, thus they are nonvolatile.

Volatile memory devices include Dynamic Random Access Memory (DRAM) and Static Random Access Memory (SRAM) devices. RAM devices in the prior art have been used for temporary data storage, such as during data manipulation, since writing data into, and reading data out of, the device is performed quickly and easily. However, a disadvantage of these devices is that they require the constant application of power, such as in the form of a data refresh signal, to refresh and maintain data stored in the memory cells of the chip. Once power supplied to the device is interrupted, the data stored in the memory cells of the chip is lost.

Hence, if one of the volatile memory devices can combine with a nonvolatile memory device, and thereby a nonvolatile memory device with advantages of high memory capacity, simple memory cell structure, fast data access, and nonvolatility, is provided.

SUMMARY OF THE INVENTION

The present invention provides a nonvolatile semiconductor memory device. A nonvolatile erasable programmable transistor having high process compatibility with conventional DRAM device is replaced to serve as a nonvolatile flash memory device. The cost of manufacture is low, and the memory device is easy to operation and has the advantages of both DRAM and flash memory.

The present invention provides a nonvolatile semiconductor memory device adapted for a semiconductor substrate is comprised of a control transistor having a first gate connected to a first word line, a first source connected to a first bit line, and a first drain; a storage capacitor connected to the first drain, and data stored in the capacitor is controlled by the control transistor; and a nonvolatile erasable programmable transistor having a second gate connected to a second word line, a second source connected to the first drain, and a second drain connected to a second bit line; wherein the data stored in the capacitor and nonvolatile erasable programmable transistor is transmitted and exchanged by a transfer circuit through the first and second bit lines.

The present invention also provides a nonvolatile memory circuit adapted for a semiconductor substrate is comprised of a plurality of dynamic random access memory (DRAM) cell, a plurality of nonvolatile erasable programmable (NEP) transistor, and a data buffer region. Each DRAM cell is comprised of a control transistor having a first gate connected to a first word line, a first source connected to a first bit line, and a first drain; and a storage capacitor connected to the first drain, and data stored in the capacitor is controlled by the control transistor. Each NEP transistor has a second gate connected to a second word line, a second source connected to the first drain, and a second drain connected to a second bit line. The data buffer region is coupled to the first and second bit lines. Wherein, the data stored in the capacitor and NEP transistor is transmitted and exchanged by the data buffer region through the first and second bit lines.

The present invention provides a method of operating a nonvolatile semiconductor memory device adapted for a nonvolatile semiconductor memory device comprised of a control transistor having a first gate connected to a first word line, a first source connected to a first bit line, and a first drain; a storage capacitor connected to the first drain, and data stored in the capacitor is controlled by the control transistor; and a nonvolatile erasable programmable transistor having a second gate connected to a second word line, a second source connected to the first drain, and a second drain connected to a second bit line, wherein the data stored in the capacitor and nonvolatile erasable programmable transistor is connected to a transfer circuit through the first and second bit lines, comprising the step of:

1) After power is turned on, the data stored in the nonvolatile erasable programmable transistor is transmitted to a transfer circuit through the second bit line, and then the data is transmitted to the storage capacitor through the first bit line;

2) After the data is transferred, the nonvolatile erasable programmable transistor is closed and the data is accessed with control transistor and storage capacitor; and 3) Before power is turned off, the data stored in the storage capacitor is transmitted to the transfer circuit through the first bit line, and then the data is transmitted to the nonvolatile erasable programmable transistor through the second bit line.

BRIEF DESCRIPTIONS OF THE DRAWINGS

FIG. 3 illustrates the nonvolatile memory device of the present invention using a dynamic random access memory (DRAM) operation mode under power is on;

FIG. 5 illustrates the nonvolatile memory device of the present invention, which the data stored in the ONO flash memory cell is transmitted to the DRAM cell while power is turned on.

DETAILED DESCRIPTIONS OF THE INVENTION

The present invention discloses a nonvolatile semiconductor memory device and its operation method. The device has high process integration, and needs low manufacture cost. It combines the advantages of both dynamic random access memory (DRAM) and flash electronic erasable programmable read only memory (Flash EEPROM), such as high memory capacity, simple memory structure, simple operating method, fast data access, and nonvolatile, etc.

Figure 1:
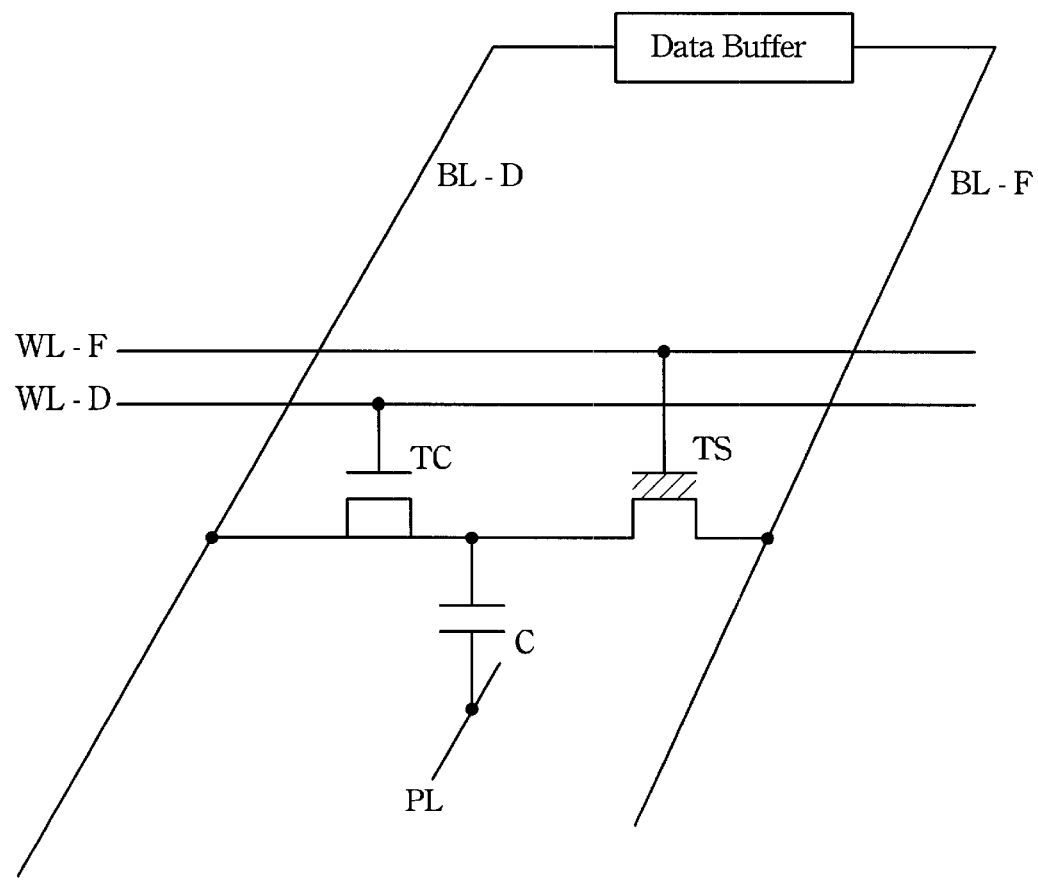
FIG. 1 illustrates a schematic circuit of a nonvolatile memory device according to the present invention.

Referring to FIG. 1, it illustrates a schematic circuit of the nonvolatile memory device of the present invention. Each memory unit of the device comprises a DRAM cell and a nonvolatile erasable programmable (NEP) transistor. The DRAM cell is preferably one transistor-one capacitor (1T-1C) structure. Each DRAM cell includes a control transistor TC and a storage capacitor C. It is well known that a transistor comprises a gate an d source/drain regions on both sides of the gate. For clearly and distinctly disclosing the present invention, the source and drain are assigned respectively, but the source and drain can be exchanged, not limited in the assignation. Hence, the control transistor TC has a first gate, a first source, and a first drain. The first gate is connected to a first word line, i.e. a word line WL-D for the DRAM cell. The source is connected to a first bit line, i.e. a bit line BL-D for the DRAM cell. The drain is connected to the storage capacitor C. By the word line WL-D and bit line BL-D, the control transistor TC can control data access of the capacitor C, i.e. it can control data writing in or reading out the capacitor C.

Adjacent to the DRAM cell, there is a NEP transistor to serve a data storable transistor TS, such as a flash memory cell. The transistor TS is most preferred a silicon oxide-silicon nitride-silicon oxide (ONO) flash memory cell which has a structure similar to the control transistor TC of the DRAM cell. The ONO flash memory cell has high process compatibility with the DRAM cell, and is very easy to integrate into one block. For example, the ONO flash memory cell is provided to serve as the NEP transistor TS. The transistor TS has a second gate, a second source, and a second drain. The second gate has a silicon oxide-silicon nitride-silicon oxide (ONO) layer, and a gate conductive layer thereon, such as polysilicon layer. Data is stored into the silicon nitride layer of the transistor TS, and not disappeared while power is turned off, and therefore, the transistor TS is nonvolatile. The second gate is connected to a second word line, i.e. a word line WL-F for flash memory cell. The second source is connected to the first drain of the transistor TC with the capacitor C. Since the first drain and second source is coupled and the control transistor TC and NEP transistor TS is neighboring, the first drain and second source can be a common source/drain to increase the integration of the device.

The fist and second bit lines BL-D and BL-F are connected to a transfer circuit, such as a data buffer region, for transmitting data. The data stored in the capacitor C and NEP transistor TS can be transmitted and exchanged through the circuit. The data stored in the capacitor C is transmitted to the data buffer region through the first bit line BL-D, and then transmitted again to the NEP transistor TS through the second bit line BL-F. Reversely, the data stored in the NEP transistor TS is transmitted to the data buffer region through the second bit line BL-F, and then transmitted again to the storage capacitor C through the first bit line BL-D.

Figure 2:
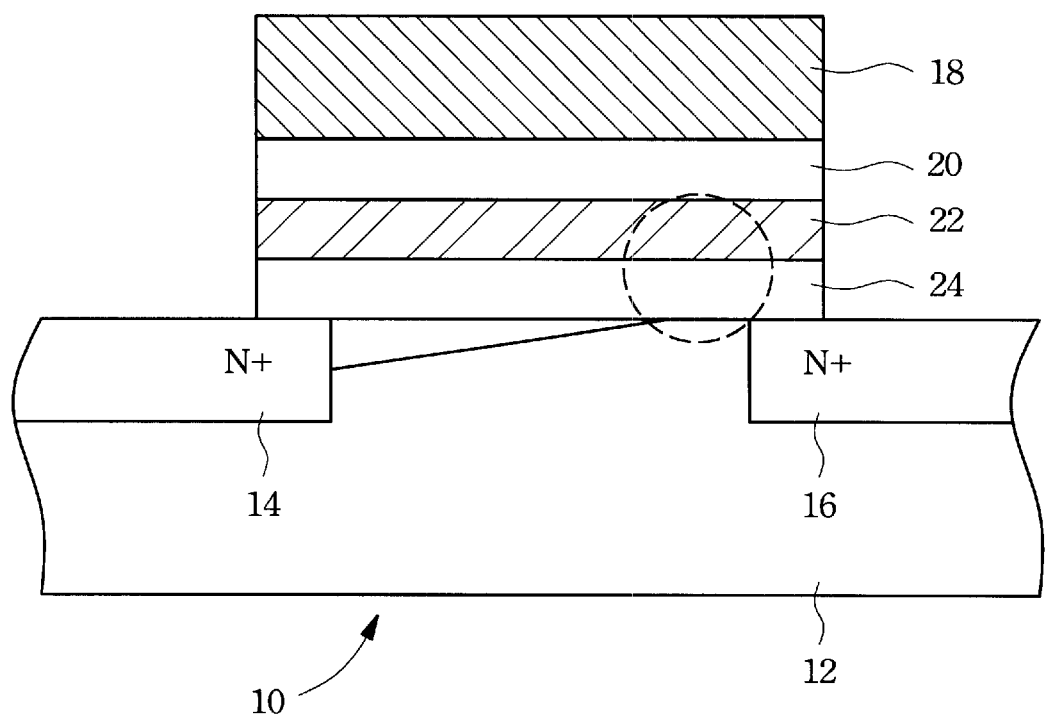
FIG. 2 illustrates a cross-sectional view of an ONO flash memory cell of the preferred embodiment of the present invention.

Now, the structure of ONO flash memory cell will be described in detail to understand the advantages of the ONO flash memory cell. Referring to FIG. 2, it illustrates a cross-sectional view of the ONO flash memory cell. As shown in FIG. 2, the ONO flash memory cell 10 is constructed on a semiconductor substrate 12. The ONO flash memory cell 10 includes a source 14 and a drain 16, a stacked gate layer on the channel between the source and drain 14 and 16. The stacked gate layer is comprised of a ONO layer with a silicon oxide layer 18, a silicon nitride layer 20, a silicon oxide layer 22, and a gate conductive layer 24 thereon, such as a polysilicon layer. By utilizing hot electron injection technology, storage charge is injected into the drain side of the silicon nitride layer 20 to store data "0" or "1", as the circle shown in FIG. 2. And, the stored data is compensated by utilizing hot hole injection technology to erase the storage charge in the silicon nitride layer 20.

Since the ONO flash memory cell 10 (i.e. NEP transistor TS) is very similar to the conventional control transistor TC of DRAM cell except silicon oxide layer 18 and silicon nitride layer 20. All of fabricating process of the NEP transistor TS can be integrated with the control transistor TC except depositing a silicon oxide layer and a silicon nitride layer. Therefore, process integration of the device of the present invention is high. We can easily fabricate nonvolatile memory device with high capacity, and without increasing a lot of manufacture cost, so the manufacture cost of the device of the present invention is low. In addition, detailed description of illustrating the ONO flash memory cell is referred to U.S. Pat. Nos. 5,168,334 and 5,768,192.

Figure 3:
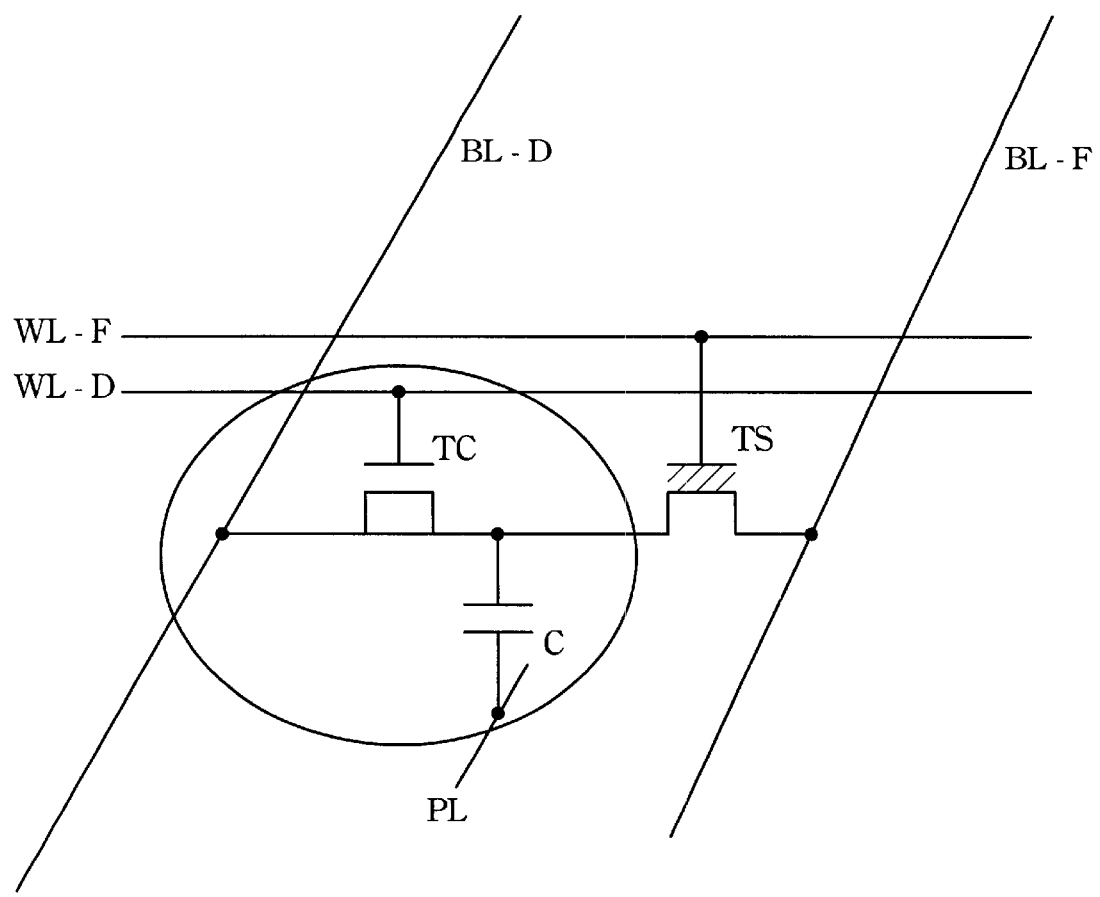

The method of operating the nonvolatile memory device of the present invention mainly includes three steps. Referring to FIG. 3, as power is on in general, the NEP transistor TS is closed, and data is only accessed with the DRAM cell (including the control transistor TC and storage capacitor C) to serve as the memory device, as the circle shown in FIG. 3. Hence, the nonvolatile memory device now has the advantages of the DRAM cell, such as fast data access, etc., and without cycling and endurance issue.

Figure 4:
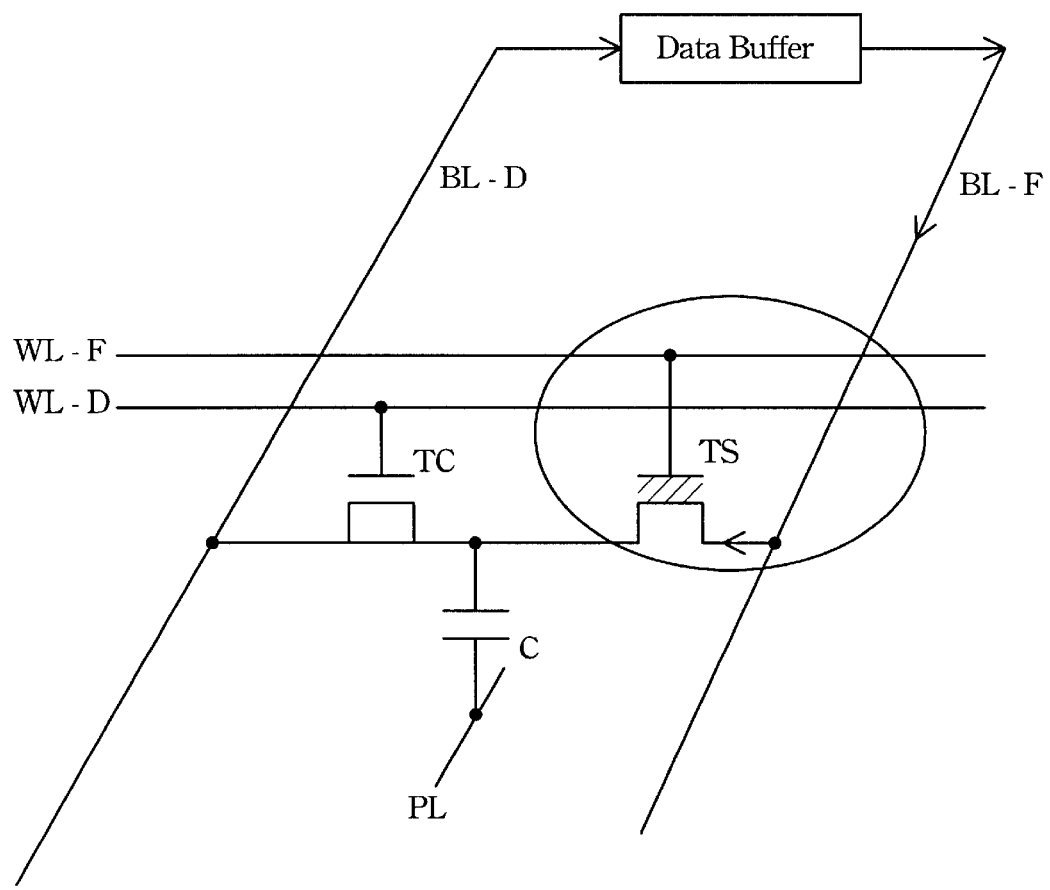
FIG. 4 illustrates the nonvolatile memory device of the present invention, which the data stored in the DRAM cell is transmitted to the corresponding ONO flash memory cell while power is going to be turned off.

Referring to FIG. 4, before power is going to be turned off, the data stored in the capacitor C of the DRAM cell is read out and transmitted to the transfer circuit, such as data buffer region, through the first bit line BL-D, and then, transmitted and written into the NEP transistor TS through the second bit line BL-F. The control transistor TC here is on to be operated at linear region. Since the NEP transistor is nonvolatile, the data stored therein can be maintained after power is turned off.

Figure 5:
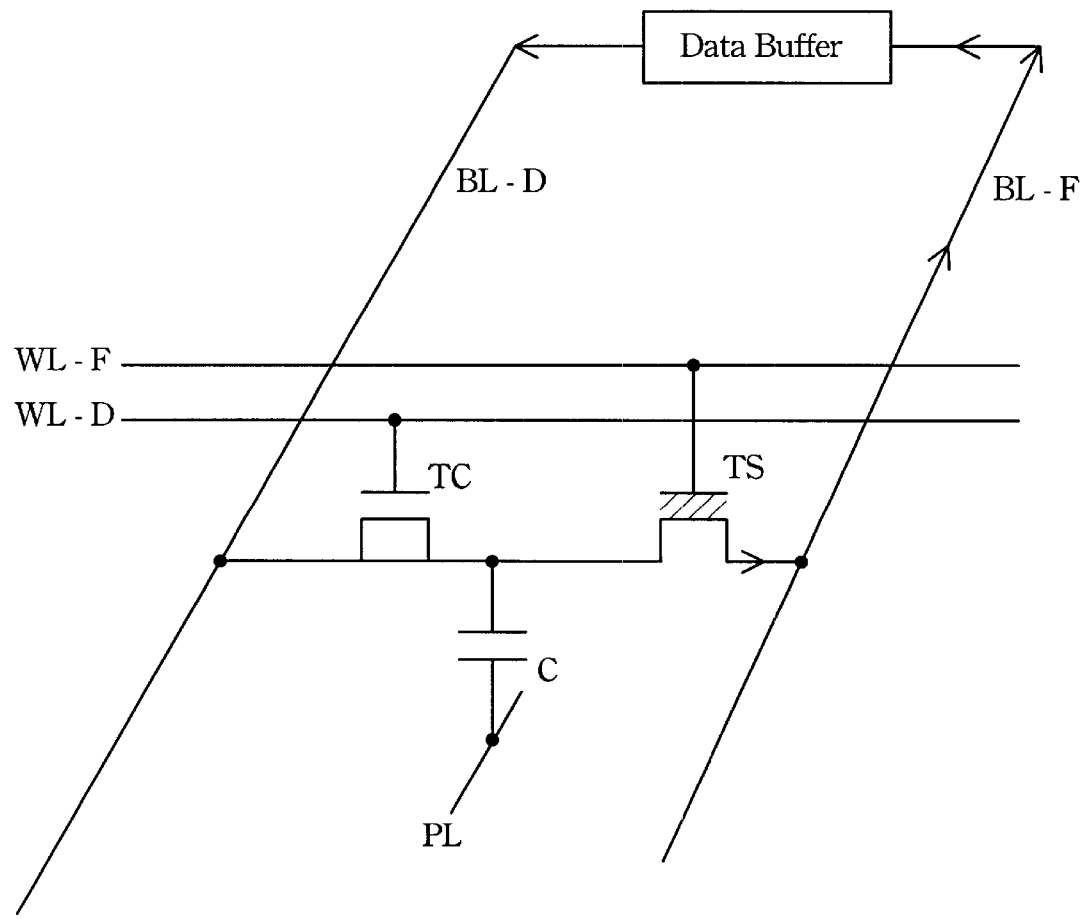

Referring to FIG. 5, in next time of using the memory device, after power is turned on, the data stored in the NEP transistor is read out and transmitted to the transfer circuit, such as data buffer region, through the second bit line BL-F, and then transmitted and written into the storage capacitor C of DRAM cell through the first bit line BL-D. Hence, the data is converted to the DRAM cell before operating the DRAM cell, so the DRAM cell can be continually operated according to previous data storage. After the data is converted to the DRAM cell, the NEP transistor TS is closed, and data is accessed only with the DRAM cell, as shown in FIG. 3.

According to the nonvolatile memory device of the present invention, since the DRAM cell and NEP transistor TS is neighbored, the structure is relatively simple and simplify the circuit of the device, and therefore, access path is shortened, and access speed is increased while data converting.

A nonvolatile memory is constructed of a memory array with memory units of the nonvolatile memory device of the present invention, and in addition to periphery circuits. The nonvolatile memory at least comprises a memory array, a data buffer region to convert data, and periphery circuits, such as Address Decoder, and I/O, etc. Wherein, the memory array is constructed of a plurality of the nonvolatile memory device of the present invention at least comprising a control transistor TC, a storage capacitor C, and a NEP transistor TS.

According to the above description, the present invention provides a nonvolatile semiconductor memory device. A DRAM cell is integrated with a nonvolatile erasable programmable (NEP) transistor to form a nonvolatile DRAM device. The process compatibility of the DRAM cell and NEP transistor is high and they are easy to be combined without increasing lots of fabricating cost. Therefore, the cost is low. In addition, the nonvolatile semiconductor memory device of the present invention has both advantages of the DRAM cell and NEP transistor. It has fast data access, long device lifetime and nonvolatile, etc.

While the preferred embodiment of the invention has been illustrated and described, it will be appreciated that various changes can be made therein without departing from the spirit and scope of the invention.

What is claimed is:

1. A nonvolatile semiconductor memory device adapted for a semiconductor substrate, comprising:
   a control transistor having a first gate connected to a first word line, a first source connected to a first bit line, and a first drain;
   a storage capacitor connected to the first drain, and data stored in the capacitor is controlled by the control transistor; and
   a nonvolatile erasable programmable transistor having a second gate connected to a second word line, a second source connected to the first drain, and a second drain connected to a second bit line;
   wherein the data stored in the capacitor and nonvolatile erasable programmable transistor is transmitted and exchanged by a transfer circuit through the first and second bit lines.

2. The device according to claim 1, wherein the nonvolatile erasable programmable transistor includes an ONO flash memory cell.

3. The device according to claim 2, wherein the ONO flash memory cell has a gate comprised of a silicon oxide-silicon nitride-silicon oxide layer and a gate conductive layer thereon.

4. The device according to claim 3, wherein a material of the gate conductive layer comprises polysilicon.

5. The device according to claim 3, wherein data is stored in the silicon nitride layer of the ONO flash memory cell.

6. A nonvolatile memory circuit adapted for a semiconductor substrate, comprising:
   a plurality of dynamic random access memory (DRAM) cell, which each DRAM cell comprising:
      a control transistor having a first gate connected to a first word line, a first source connected to a first bit line, and a first drain; and
      a storage capacitor connected to the first drain, and data stored in the capacitor is controlled by the control transistor;
   a plurality of nonvolatile erasable programmable transistor, which each nonvolatile erasable programmable transistor has a second gate connected to a second word line, a second source connected to the first drain, and a second drain connected to a second bit line; and
   a data buffer region coupling to the first and second bit lines;
   wherein the data stored in the capacitor and nonvolatile erasable programmable transistor is transmitted and exchanged by the data buffer region through the first and second bit lines.

7. The circuit according to claim 6, wherein the nonvolatile erasable programmable transistor includes an ONO flash memory cell.

8. The circuit according to claim 7, wherein the ONO flash memory cell has a gate comprised of a silicon oxide-silicon nitride-silicon oxide layer and a gate conductive layer thereon.

9. The circuit according to claim 8, wherein a material of the gate conductive layer comprises polysilicon.

10. The circuit according to claim 8, wherein data is stored in the silicon nitride layer of the ONO flash memory cell.

11. The circuit according to claim 6, further comprises an address decoder and an input/output circuit.

12. A method of operating a nonvolatile semiconductor memory device adapted for a nonvolatile semiconductor memory device comprised of a control transistor having a first gate connected to a first word line, a first source connected to a first bit line, and a first drain; a storage capacitor connected to the first drain, and data stored in the capacitor is controlled by the control transistor; and a nonvolatile erasable programmable transistor having a second gate connected to a second word line, a second source connected to the first drain, and a second drain connected to a second bit line, wherein the data stored in the capacitor and nonvolatile erasable programmable transistor is connected to a transfer circuit through the first and second bit lines, comprising the step of:
   1) after power is turned on, the data stored in the nonvolatile erasable programmable transistor is transmitted to the transfer circuit through the second bit line, and then the data is transmitted to the storage capacitor through the first bit line;
   2) after the data is transferred, the nonvolatile erasable programmable transistor is closed and the data is accessed with the control transistor and the storage capacitor; and
   3) before power is turned off, the data stored in the storage capacitor is transmitted to the transfer circuit through the first bit line, and then the data is transmitted to the nonvolatile erasable programmable transistor through the second bit line.

13. The method according to claim 12, wherein the nonvolatile erasable programmable transistor includes an ONO flash memory cell.

14. The method according to claim 13, wherein the ONO flash memory cell has a gate comprised of a silicon oxide-silicon nitride-silicon oxide layer and a gate conductive layer thereon.

15. The method according to claim 14, wherein data is stored in the silicon nitride layer of the ONO flash memory cell.

* * * * *